(12) United States Patent
Yamaguchi

(10) Patent No.: US 8,298,448 B2
(45) Date of Patent: Oct. 30, 2012

(54) LOW TEMPERATURE CO-FIRED CERAMIC CIRCUIT BOARD

(75) Inventor: Kazuhiro Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 119 days.

(21) Appl. No.: 12/866,958

(22) PCT Filed: Feb. 19, 2009

(86) PCT No.: PCT/JP2009/052878
§ 371 (c)(1),
(2), (4) Date: Aug. 10, 2010

(87) PCT Pub. No.: WO2009/122806
PCT Pub. Date: Oct. 8, 2009

(65) Prior Publication Data
US 2010/0320425 A1   Dec. 23, 2010

(30) Foreign Application Priority Data
Mar. 31, 2008  (JP) .................................. 2008-091890

(51) Int. Cl.
*H01B 1/02* (2006.01)
*H01B 1/22* (2006.01)
(52) U.S. Cl. ...................... 252/514; 106/31.32; 428/210; 501/32
(58) Field of Classification Search .................. 252/514; 106/31.32; 428/210; 501/32
See application file for complete search history.

(56) References Cited

U.S. PATENT DOCUMENTS

| 5,162,062 A | 11/1992 | Carroll et al. |
| 6,147,019 A | 11/2000 | Donohue |
| 7,544,629 B2* | 6/2009 | Ito et al. .......................... 501/32 |
| 7,682,998 B2 | 3/2010 | Nozaki et al. |

FOREIGN PATENT DOCUMENTS

| JP | 4 329691 | 11/1992 |
| JP | 5 136566 | 6/1993 |
| JP | 6 305770 | 11/1994 |

(Continued)

OTHER PUBLICATIONS

Japanese Office Action issued Oct. 18, 2011, in Patent Application No. 2010-505454.

(Continued)

*Primary Examiner* — Khanh Tuan Nguyen
(74) *Attorney, Agent, or Firm* — Oblon, Spivak, McClelland, Maier & Neustadt, L.L.P.

(57) ABSTRACT

A low-temperature fired ceramic circuit board with little warpage, few conductor wrinkles, low hygroscopicity, excellent dielectric properties, and a glass-free flat surface formed by simultaneously firing a conductor paste and a green sheet at 800 to 900° C. The green sheet comprises (1) glass powder including 35 to 39 wt. % $SiO_2$, 9 to 17 wt. % $Al_2O_3$, 21 to 40 wt. % $B_2O_3$, 10 to 20 wt. % R'O (R' being at least one of Mg, Ca, and Ba), 0.2 to 2 wt. % $Li_2O$, and 0.5 to 2 wt. % $MO_2$ (M being at least one of Ti and Zr), and (2) alumina powder, the weight ratio of glass powder to alumina powder being 4:6 to 6:4. The conductor paste comprises Ag-containing metal particles, binder, and a heat decomposable alkali metal compound, with 0.13 to 7.8 alkali metal atoms in the paste per 100 metal atoms in the particles.

12 Claims, 1 Drawing Sheet

BINDER-REMOVING AND FIRING TREATMENT

FOREIGN PATENT DOCUMENTS

| | | | |
|---|---|---|---|
| JP | 06-305770 | * | 11/1994 |
| JP | 9 161539 | | 6/1997 |
| JP | 11-214829 | | 8/1999 |
| JP | 11 292567 | | 10/1999 |
| JP | 11 335134 | | 12/1999 |
| JP | 2000-203878 | * | 7/2000 |
| JP | 2003 128431 | | 5/2003 |
| JP | 2005 68008 | | 3/2005 |
| JP | 2005 126250 | | 5/2005 |
| JP | 2007-59414 | | 3/2007 |
| JP | 2007-095704 | * | 4/2007 |
| JP | 2007-95704 | | 4/2007 |
| JP | 2007 109473 | | 4/2007 |
| TW | 342578 | | 10/1998 |

OTHER PUBLICATIONS

Office Action issued Jan. 12, 2012 in Taiwanese Application No. 098106804.

* cited by examiner

LOW TEMPERATURE CO-FIRED CERAMIC CIRCUIT BOARD

TECHNICAL FIELD

The present invention relates to a low-temperature fired ceramic circuit board, and more specifically, to a low-temperature fired ceramic circuit board used for various devices in the fields of information communications, automobiles, etc.

BACKGROUND ART

A low-temperature fired ceramic circuit board has such advantages as being excellent in high frequency property and heat dissipation properties, being able to use a low-loss conductor, and being applicable to a base for an airtight sealed package. Thus, low-temperature fired ceramic circuit boards have been in practical use as a base mounted on an electronic device or a constitutional member of an electronic device package. Low-temperature fired ceramic circuit boards are multilayer boards in which circuit wiring is incorporated, the circuit wiring being obtained by forming a circuit pattern with a conductor paste on a green sheet produced from a powder for a green sheet containing a glass powder and an alumina powder, then laminating a plurality of the green sheets to form an integrated laminate, and firing the laminate at low temperatures. Ceramics used for the green sheet can be fired at 1000° C. or lower, and hence the ceramics are called "low-temperature fired ceramics" as a comparative expression to ceramics such as alumina whose firing temperature is as high as 1500° C. or higher.

In a high-temperature fired ceramic circuit board using an alumina green sheet, etc., a high-melting-point, high-resistance metal such as W or Mo is used as a conductor material. Accordingly, the board has high conductor resistance, and hence the board has such a problem that circuit loss is large. In addition, in a process of manufacturing high-temperature fired ceramic circuit boards, a reduction atmosphere is required, resulting in a complicated manufacturing process and a complicated manufacturing facility.

In contrast, in the low-temperature fired ceramic circuit board, a low-resistance metal such as Au or Ag is used as a conductor material, and hence the board is low in circuit loss. Here, when the low-temperature fired ceramic circuit board is manufactured, the firing temperature needs to be lower than the melting points of Au and Ag. Thus, a green sheet is produced by using a powder for a green sheet containing a glass powder containing, as a main component, glass that softens at lower than 900° C. to form a dense state and an alumina powder. Au and Ag are easy to use because they can be fired in air, and in particular, because Ag is inexpensive among low-resistance metals. Accordingly, a conductor paste containing Ag as a main component has been frequently used. However, Ag has a feature that it is apt to diffuse into the glass component of a green sheet.

In recent years, in the information communications field, the frequency bands of radio waves used have become higher owing to the increased amount of information and diversified communication systems, and microwave and millimeter-wave bands have come to be used. As the frequency of the radio waves used becomes higher, the more the radio waves transform into heat in a circuit, that is, transmission loss becomes higher. Thus, users who desire higher performance, lower power consumption, and higher output ability of communication equipment require a decrease in transmission loss in high-frequency bands. Factors that greatly influence transmission loss in the high-frequency bands include the dielectric properties of a ceramic board and the electric resistance of a conductor. There is little room for improvement in the conductor because Ag, which has the smallest electric resistance comparable to that of Cu, is already used in the main, and hence improving the dielectric properties of a ceramic board is important. In particular, as the frequencies become higher, the contribution ratio of dielectric properties become higher, so from the viewpoint of reducing transmission loss in high-frequency bands, a ceramic board excellent in dielectric properties (that is, low in relative dielectric constant $\in_r$ and dielectric loss tangent tan δ) must be used. Factors influencing the dielectric properties of the ceramic board include the dielectric properties of a glass component. However, there is a problem in that compatibility between the dielectric properties of the ceramic board and low-temperature firing is generally difficult.

A known conventional green sheet that provides a ceramic board is, for example, one using a powder for a green sheet containing 12 to 59.6% by weight of alumina, 18 to 69.6% by weight of borosilicate-based glass, 1 to 40% by weight of anorthite crystals, and 1 to 5% by weight of celsian crystals (see Patent Document 1, for example). The green sheet can be fired at low temperatures regardless of firing atmospheres and can provide a ceramic board with a low relative dielectric constant $\in_r$ and excellent mechanical strength.

In addition, compositions of aluminosilicate-based glass low in relative dielectric constant $\in_r$ and dielectric loss tangent tanδ are also known (see Patent Document 2, for example).

Patent Document 1: JP 6-305770 A
Patent Document 2: JP 11-292567 A

DISCLOSURE OF THE INVENTION

Problems to be Solved by the Invention

However, Patent Document 1 mentions neither the problem of transmission loss in high-frequency bands (microwave and millimeter-wave bands) nor a method of achieving compatibility between dielectric properties and low-temperature firing. In fact, a ceramic board obtained from a green sheet produced using the powder for a green sheet of Patent Document 1 has insufficient performance as a board for high-frequency bands because of its large transmission loss in high-frequency bands compared with alumina boards, which is a conventional material. In general, the transmission loss of alumina in high-frequency bands is small compared with that of borosilicate-based glass or aluminosilicate-based glass, and hence it is assumed that the transmission loss in high-frequency bands can be reduced to a certain degree by increasing the amount of alumina incorporated into the powder for a green sheet of Patent Document 1. However, the above-mentioned powder for a green sheet cannot be used for a low-temperature fired ceramic circuit board because problems in terms of water absorption property and lack of strength may occur. Thus, the development of a glass component with small transmission loss in high-frequency bands has still been desired.

On the other hand, Patent Document 2 discloses the composition of aluminosilicate-based glass low in relative dielectric constant $\in_r$ and dielectric loss tangent tan δ. However, a glass composition having this composition is meant to be used for glass fibers and has a high softening temperature and a high viscosity even after softening, and hence the glass composition is inappropriate as a glass component used for powder for a green sheet.

At first, the inventors of the present invention prepared powders for a green sheet containing the glass composition of Patent Document 2 and an alumina powder at various mix ratios, to produce green sheets using the powders for a green sheet to obtain ceramic boards, and evaluated each of the ceramic boards for porosity and dielectric properties in a microwave band. Also, a ceramic board made from the green sheet produced using the powder for a green sheet of Patent Document 1 as a comparative object was evaluated in the same way as above. As a result, the ceramic board obtained from the green sheet produced using the powder for a green sheet containing the glass composition of Patent Document 2 was found to exhibit good dielectric properties and in most cases, to have small transmission loss compared with the ceramic board of Patent Document 1.

However, in the case where the mix ratio of a glass component was in the range of 40 to 70 vol %, while the porosities of general ceramic boards including that of Patent Document 1 were about 2%, the porosity of the ceramic board obtained from the green sheet produced using the powder for a green sheet containing the glass composition of Patent Document 2 was as high as about 20%. That is, the ceramic board obtained from the green sheet produced using the powder for a green sheet containing the glass composition of Patent Document 2 has higher hygroscopicity and does not have the environmental resistance and airtightness required for a product. A factor for the increase in the porosity of the ceramic board as mentioned above is assumed to be as described below. That is, the use of the glass composition of Patent Document 2 leads to a high viscosity of glass after softening, resulting in the prevention of a process that allows softened glass components to flow into spaces between alumina powder to form a dense state. Thus, the glass component for a powder for a green sheet used for a green sheet that provides a ceramic board for use in high-frequency bands must be small in transmission loss and must have a proper softening point and a proper viscosity.

On the other hand, in the case where firing is conducted for a plurality of green sheets on each of which a circuit pattern has been formed using an Ag-based conductor paste, Ag has the feature that it is apt to diffuse into the glass component in the green sheet, and hence insulating properties between Ag conductors (circuits) are decreased, minute circuit patterns disappear, and dielectric properties decline. In addition, in a green sheet in which Ag diffuses, the softening point of a glass component declines, and hence shrinkage behavior in the part changes to cause shrinkage unevenness, resulting in board warpage. In addition, owing to a decline in the softening point of the glass component, the viscosity of the glass component is decreased at a temperature lower than a predetermined temperature, and the glass component infiltrates a conductor before sintering starts. As a result, the volume of the conductor increases because of the glass component that has infiltrated, desired shrinkage is not provided for the conductor during firing, and conductor wrinkles and coming up of the glass component result.

Moreover, the above-mentioned problems associated with the Ag diffusion also have a bad influence when a low-temperature fired ceramic circuit board is used in an electronic device. For example, when an Ag conductor is kept in the air, the Ag conductor is oxidized and sulfurated. As a result, it becomes difficult to perform part mounting and wire bonding. In view of the foregoing, plating is applied on the Ag conductor. However, when a large amount of a glass component comes up on the conductor surface, the part where the glass component has came up resists plating, producing a plating defect. As a result, in some cases, a plating treatment liquid remains to produce a stain, the remaining liquid is boiled during a heating step in soldering or the like to cause solder scattering, or the bonding strength of the wire bonding lowers. In addition, when the degree of board warpage and conductor wrinkle is large, the board does not perform its basic functions. Further, when the surface roughness represented by the maximum height difference is larger than about 8 μm in the conductor wrinkles, which is the maximum value of the range suitable for wire bonding typified by a minute wire having a diameter of 25 μm, wire bonding becomes impossible. It should be noted that the surface roughness is desirably 6 μm or less in order to attain wire bonding with a more stable bonding strength.

The present invention has been made to solve the above-mentioned problems. An object of the present invention is to provide a low-temperature fired ceramic circuit board that: can be fired at 900° C. or lower; has a small degree of board warpage and conductor wrinkles when simultaneous firing is performed with an Ag-based conductor paste; is low in hygroscopicity; is excellent in dielectric properties in high-frequency bands (microwave and millimeter-wave bands); and has a flat circuit surface free from coming up of a glass component.

Means for Solving the Problems

The inventors of the present invention have made intensive studies on the component composition of a green sheet serving as an insulating layer and the component composition of a conductor paste serving as a circuit in a low-temperature fired ceramic circuit board. As a result, the inventors have found that each of a green sheet having specific component composition and a conductor paste having specific component composition has an inhibiting effect on diffusion of the Ag into the glass component in the green sheet. Moreover, the inventors have found that the combined use of the green sheet and the conductor paste synergistically enhances the inhibiting effect on Ag diffusion into the glass component in the green sheet, resulting in possible solutions to the above-mentioned problems.

That is, according to the present invention, there is provided a low-temperature fired ceramic circuit board formed by subjecting a conductor paste and a green sheet to simultaneous firing at 800 to 900° C., wherein: the green sheet contains a glass powder which contains 35 to 39% by weight of $SiO_2$, 9 to 17% by weight of $Al_2O_3$, 21 to 40% by weight of $B_2O_3$, 10 to 20% by weight of R'O (where R represents at least one kind selected from the group consisting of Mg, Ca, and Ba), 0.2 to 2% by weight of $Li_2O$, and 0.5 to 2% by weight of $MO_2$ (where M represents at least one kind selected from the group consisting of Ti and Zr), and an alumina powder at a weight ratio of the glass powder to the alumina powder of 4:6 to 6:4; and the conductor paste contains Ag-containing metal particles, a binder component, and a heat decomposable alkali metal compound, and the content of the heat decomposable alkali metal compound is such that 0.13 to 7.8 alkali metal atoms are contained for each 100 metal atoms in the metal particles.

Effect of the Invention

According to the present invention, there can be provided a low-temperature fired ceramic circuit board that: can be fired at 900° C. or lower; has a small degree of board warpage and conductor wrinkles when simultaneous firing is performed with an Ag-based conductor paste; is low in hygroscopicity; is excellent in dielectric properties in high-frequency bands (microwave and millimeter-wave bands); and has a flat circuit surface free from coming up of a glass component.

BEST MODE FOR CARRYING OUT THE INVENTION

Embodiment 1

Figure 1:
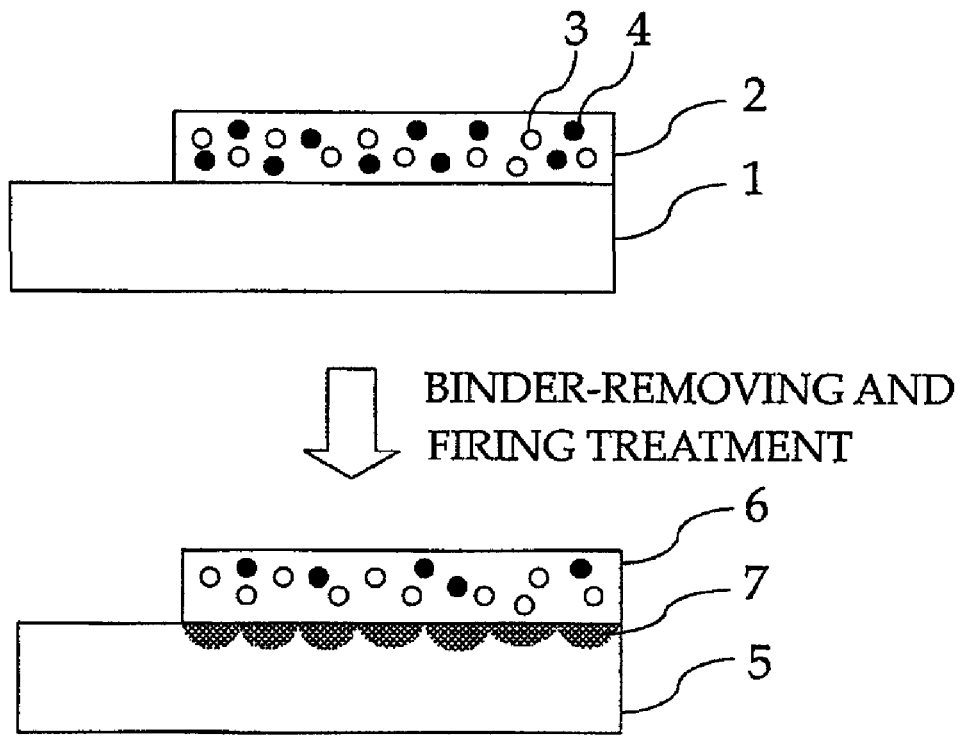
FIG. 1 is a diagram illustrating a manufacturing process of a low-temperature fired ceramic circuit board in this embodiment.

A low-temperature fired ceramic circuit board of the present invention is formed by subjecting a conductor paste and a green sheet to simultaneous firing at 800 to 900° C. Hereinafter, detailed description is made on the conductor paste, the green sheet, and the low-temperature fired ceramic circuit board produced by using them.

(Green Sheet)

The green sheet in this embodiment contains a powder for a green sheet formed of a glass powder and an alumina powder.

The glass powder used in this embodiment is a powder of glass which contains, as constituents, $SiO_2$, $Al_2O_3$, $B_2O_3$, R'O (where R' represents at least one kind selected from the group consisting of Mg, Ca, and Ba), $Li_2O$, and $MO_2$ (where M represents at least one kind selected from the group consisting of Ti and Zr).

Among the constituents of glass, $SiO_2$ is a glass material which itself vitrifies. However, the softening point of pure $SiO_2$ is far beyond 1000° C., and hence the softening point of glass containing $SiO_2$ in a large amount becomes high.

The content of $SiO_2$ is therefore 35 to 39% by weight, or preferably 37 to 39% by weight. If the content of $SiO_2$ is less than 35% by weight, glass cannot be constantly obtained from a molten material, or chemically stable glass cannot be obtained. On the other hand, if the content of $SiO_2$ is more than 39% by weight, the softening point of glass becomes higher, resulting in difficulty in performing low-temperature firing.

$B_2O_3$ is also a glass material which itself vitrifies. Incorporating $B_2O_3$ into glass containing $SiO_2$ can lower the softening point of the glass. Further, $B_2O_3$ forms a boron-oxygen bond in a glass skeleton. The bond has a stronger covalent character and a smaller electric dipole moment than those of a silicon-oxygen bond, and thus becomes inert to electromagnetic waves, leading to smaller transmission loss.

However, if glass contains $B_2O_3$ in a large amount, oxygen coordination similar to that of boric acid is produced, resulting in chemically unstable glass. Thus, when simultaneous firing is performed using a green sheet containing such glass and an Ag-based conductor paste, the Ag remarkably diffuses into the glass component in the green sheet.

The content of $B_2O_3$ is therefore 21 to 40% by weight, or preferably 22 to 28% by weight. If the content of $B_2O_3$ is less than 21% by weight, desired dielectric properties are not provided. On the other hand, if the content of $B_2O_3$ is more than 30% by weight, as the content of $B_2O_3$ increases, glass becomes less stable chemically, and as a result, glass becomes lower in water resistance, acid resistance, and alkali resistance. Therefore, some modification must be made on steps such as a gold plating step which is usually performed in the manufacture of a high frequency part. Specifically required is modification such as neutralizing a plating bath or imparting a moisture-proof effect by using a fluororesin, etc. It should be noted that, if the content of $B_2O_3$ is more than 40% by weight, the chemical stability of glass declines remarkably, and hence, even if the above-mentioned modification is made, a high frequency part with desired characteristics can not be obtained.

R'O (where R' represents at least one kind selected from the group consisting of Mg, Ca, and Ba), which is an alkali earth metal oxide, and $Li_2O$, which is an alkali metal oxide, themselves do not vitrify, but they are glass modifiers imparting various properties. These R'O and $Li_2O$ can decrease the viscosity because an alkali metal and an alkali earth metal, which are chemically basic, are present in ion-like form in a molecular-scale network structure present in glass and modify the glass to cleave a glass skeleton. Meanwhile, $Li_2O$, which is an alkali metal oxide, has a function of inhibiting Ag diffusion, and hence can reduce board warpage and conductor wrinkles.

However, in the network structure described above, the potential curve of the bond energy for both the alkali metal and the alkali earth metal is gentle compared with that of the glass skeleton. Thus, if the amounts of the alkali earth metal oxide and alkali metal oxide become larger, dielectric relaxation becomes larger and transmission loss also becomes larger. However, lithium is the lightest element among the alkali metals and has a short bond distance, and hence the eigenfrequency of an electric dipole moment is high and the value of the moment is small. Accordingly, if the alkali metal is limited to $Li_2O$, increases in the transmission loss can also be inhibited.

The content of R'O (where R' represents at least one kind selected from the group consisting of Mg, Ca, and Ba) is 10 to 20% by weight, or preferably 16 to 18% by weight. If the content of R'O is less than 10% by weight, the viscosity of glass is high. On the other hand, if the content of R'O is more than 20% by weight, either glass cannot be stably obtained from a molten material or desired dielectric properties cannot be provided.

The content of $Li_2O$ is 0.2 to 2% by weight, or preferably 0.5 to 1% by weight. If the content of $Li_2O$ is less than 0.2% by weight, the viscosity of glass is high, and Ag diffusion cannot be sufficiently inhibited. On the other hand, if the content of $Li_2O$ is more than 2% by weight, desired dielectric properties cannot be obtained.

$Al_2O_3$ itself does not vitrify, either, but is a glass modifier imparting various properties. $Al_2O_3$ can improve chemical stability.

The content of $Al_2O_3$ is 9 to 17% by weight, or preferably 12 to 16% by weight. If the content of $Al_2O_3$ is less than 12% by weight, as the content of $Al_2O_3$ increases, glass becomes less stable chemically, and as a result, glass becomes lower in water resistance, acid resistance, and alkali resistance. Therefore, some modification must be made on steps such as a gold plating step which is usually performed in the manufacture of a high frequency part. Specifically required is modification such as neutralizing a plating bath or imparting a moisture-proof effect by using a fluororesin, etc. It should be noted that, if the content of $Al_2O_3$ is less than 9% by weight, the chemical stability of glass declines remarkably, and hence, even if the above-mentioned modification is made, a high frequency part with desired characteristics can not be obtained. On the other hand, if the content of $Al_2O_3$ is more than 17% by weight, glass cannot be stably obtained from a molten material.

$MO_2$ (where M represents at least one kind selected from the group consisting of Ti and Zr) itself does not vitrify, either, but is a glass modifier imparting various properties. $MO_2$ can impart desired viscosity and fluidity to glass.

The content of $MO_2$ (where M represents at least one kind selected from the group consisting of Ti and Zr) in glass is 0.5 to 2% by weight, or preferably 0.5 to 1% by weight. If the content of $MO_2$ is less than 0.5% by weight, desired viscosity and fluidity are difficult to obtain. On the other hand, if the content of $MO_2$ is more than 2% by weight, desired dielectric properties cannot be obtained.

From the viewpoint of imparting better viscosity and fluidity to glass, ZnO and CuO may be added as constituents. In this case, the content of ZnO in glass is preferably more than 0% by weight and 10% by weight or less, or more preferably 4 to 6% by weight. If the content of ZnO is more than 10% by weight, desired dielectric properties cannot be obtained because of the reduced ratio of any other glass component. Meanwhile, the content of CuO in glass is preferably more than 0% by weight and 0.5% by weight or less. If the content of CuO is more than 0.5% by weight, desired dielectric properties cannot be obtained.

It should be noted that it is acceptable if the final glass composition of the glass in this embodiment falls within the above-mentioned ranges. For example, a glass composition that falls within the above ranges may be prepared by combining multiple kinds of a glass having glass composition outside of the above-mentioned ranges.

The glass powder in this embodiment can be prepared by mixing and melting the above-mentioned constituents and pulverizing the resultant product in accordance with conventionally known methods. The melting temperature may be suitably set depending on the glass composition.

Any commercially available alumina powder may be used without any particular limitation.

Although the average particle diameters of the glass powder and alumina powder in this embodiment are not particularly limited, they are preferably more than 1 μm and less than 3 μm, or more preferably 1.5 μm to 2.5 μm. If the average particle diameters are adjusted to this range, the amount of shrinkage a ceramic board after firing is reduced, and hence the warpage of the ceramic board can be decreased. In addition, appropriate degrees of density, airtightness, and moisture absorption resistance are imparted to the ceramic board after firing, and as a result, good electric characteristics can be obtained in the ceramic board.

The weight ratio of the glass powder to the alumina powder is in the range of from 4:6 where the ratio of the glass powder is smaller to 6:4 where the ratio of the glass powder is larger, or preferably 1:1. If the weight ratio of the alumina powder is too large, the ceramic board after firing has a decreased degree of density (less than 98%) and has residual open pores, with decreased electrical characteristics (particularly, increases in transmission loss) from humidity. On the other hand, if the weight ratio of the glass powder is too large, the shrinkage amount of the ceramic board after firing is increased, resulting in inconsistency with the shrinkage amount of the Ag-based conductor paste. As a result, warpage of the ceramic board becomes so significant that the ceramic board cannot be used practically, and coming up of the glass component becomes remarkable.

Powder for a green sheet can be produced by mixing the glass powder and the alumina powder at a predetermined ratio in accordance with a conventionally known method. The mixing method is not particularly limited, and the powders may be mixed using a ball mill, etc. It should be noted that, from the viewpoint of preventing contamination by impurities, the ball is preferably a hard alumina or zirconia ball with high purity.

The green sheet in this embodiment can be produced by forming slurry containing the above-mentioned powder for a green sheet into a sheet shape, followed by drying. Here, the slurry containing the powder for a green sheet can be prepared by adding a binder component, a plasticizer, a dispersant, and an organic solvent to the powder for a green sheet. Here, the binder component is not particularly limited, and any known binder component such as polyvinyl butyral or an acrylic resin can be used. The plasticizer is not particularly limited, and any known plasticizer such as dioctyl phthalate, di-n-butyl phthalate, or polyethylene glycol can be used. The dispersant is not particularly limited, and any known dispersant such as triolein can be used. The organic solvent is not particularly limited, and any known organic solvent such as toluene or ethanol can be used. The amounts of the binder component, plasticizer, dispersant, and organic solvent are not particularly limited as long as the resultant product is in the form of a slurry, and the amounts may be appropriately adjusted depending on the kind of powder for a green sheet, etc.

The method of forming the slurry containing the powder for a green sheet into a sheet shape is not particularly limited, and a doctor blade method, an extrusion method, a roll coater method, a printing method, etc., may be used depending on the thickness of the green sheet to be produced.

The green sheet thus obtained can provide a ceramic board that: can be fired at a low temperature of 900° C. or lower; has excellent dielectric properties in high-frequency bands (microwave and millimeter-wave bands); has low hygroscopicity; and has warpage or wrinkles to a small extent when the green sheet and an Ag-based conductor paste are subjected to simultaneous firing.

(Conductor Paste)

The conductor paste in this embodiment includes Ag-containing metal particles, a binder component, and a heat decomposable alkali metal compound.

Examples of the Ag-containing metal particles include Ag particles and particles each containing Ag as a main component such as Ag—Pd particles and Ag—Pt particles.

The average particle diameter of the metal particles, which is not particularly limited, is preferably smaller in consideration of the fact that thin and minute wiring is required because of the demand for the formation of a small, high frequency electronic device. If the average particle diameter of the metal particles is small, a circuit having a surface with a small surface roughness suitable for wire bonding can be obtained, and a flat low-temperature fired ceramic circuit having firing warpage to a small degree is easily obtained. However, Ag is apt to diffuse, and hence it is necessary to inhibit Ag diffusion sufficiently. In view of the foregoing, the average particle diameter of the metal particles is preferably 0.5 μm to 3 μm. If the average particle diameter is more than 3 μm, the formation of a minute circuit becomes difficult in some cases. On the other hand, if the average particle diameter is less than 0.5 μm, the aggregation of the metal particles progresses remarkably, and hence uniformly diffusing the respective metal particles in a conductor paste becomes difficult in some cases.

The heat decomposable alkali metal compound is a component that exerts the inhibiting effect on Ag diffusion into the glass component in a green sheet during firing. The heat decomposable alkali metal compound decomposes during the simultaneous firing with the green sheet, and the decomposition product diffuses into the glass component in the green sheet, inhibiting Ag diffusion into the glass component in the green sheet. This is probably because an alkali metal has the same valency as that of Ag, and alkali metals each diffuse as a substitute for Ag into the glass component in the green sheet.

It should be noted that the heat decomposable alkali metal compound decomposes during the simultaneous firing with the green sheet, and part of the decomposition product moves into the glass component in the green sheet and the balance remains in a conductor (circuit) but has substantially no influence on the characteristics such as a conductor (circuit) resistance.

The heat decomposable alkali metal compound is not particularly limited as long as the compound decomposes during the simultaneous firing with the green sheet (specifically, at a temperature of 1000° C. or lower). It is possible to use a compound in which a group including carbon, hydrogen, and oxygen is bonded to an alkali metal. Specific examples of such heat decomposable alkali metal compound include: alkali metal carbonates such as potassium carbonate, sodium carbonate, and lithium carbonate; alkali metal oxalates such as potassium oxalate, sodium oxalate, and lithium oxalate; alkali metal benzoates such as potassium benzoate; alkali metal citrates such as potassium citrate; alkali metal formates such as potassium formate; alkali metal acetates such as sodium acetate and lithium acetate; alkali metal hydrogen carbonates such as sodium hydrogen carbonate; and alkali metal hydroxides such as lithium hydroxide.

Among those compounds described above, the heat decomposable alkali metal compound is preferably an alkali metal carbonate, an alkali metal oxalate, or a mixture of them. Each of those compounds described above is decomposed into an alkali metal and carbon dioxide during the simultaneous firing with the green sheet, and hence unnecessary compounds do not remain in the conductor (circuit), and only alkali metals can be diffused into the glass composition in the green sheet. In addition, if the unnecessary compounds do not remain in the conductor (circuit), the volume of the heat decomposable alkali metal compound itself contained in the conductor paste decreases during firing. As a result, increasing the shrinkage ratio of the conductor paste also becomes possible.

Further, the alkali metal of the above-mentioned compounds is preferably potassium, sodium, or a mixture of them. Each of those alkali metals exerts the effects described above to a larger extent.

The content of the heat decomposable alkali metal compound in the conductor paste is such that 0.13 to 7.8 alkali metal atoms are contained for each 100 metal atoms in the metal particles. Further, the atom ratio of the alkali metal atoms is preferably 0.78 to 4.8 from the viewpoint of stability of processing. If the atom ratio of the alkali metal atoms is less than 0.13, the desired inhibiting effect on Ag diffusion is not provided. On the other hand, if the atom ratio of the alkali metal atoms is more than 7.8, the volume ratio of the alkali metal atoms in the conductor paste becomes larger, and hence a uniform kneaded state is not provided during the production of the conductor paste. Further, during the simultaneous firing with the green sheet, the quality of the conductor (circuit) becomes uneven, resulting in an unstable conductor resistance.

The binder component is not particularly limited as long as it can be used in the conductor paste. It is possible to use a cellulose-based resin such as ethyl cellulose or methyl cellulose, or an acrylic resin such as methyl methacrylate or ethyl methacrylate as the binder component.

Further, the content of the binder component in the conductor paste is not particularly limited, and may be suitably adjusted depending, for example, on the kinds and amounts of the metal particles and heat decomposable alkali metal compound.

The conductor paste in this embodiment can further contain a dispersant, a solvent, and a plasticizer. Those components are not particularly limited as long as they can be used in the conductor paste, and various conventionally known components can be used. Further, the content of the above-mentioned components in the conductor paste in this embodiment is not particularly limited, either, and may be suitably adjusted depending, for example, on the kinds and amounts of the metal particles and heat decomposable alkali metal compound.

Further, the conductor paste in the present invention can be manufactured by kneading the above-mentioned components. The kneading method is not particularly limited, and any conventionally known method may be adopted. For example, the components have only to be kneaded using an automatic mortar until the whole becomes paste-like.

The conductor paste thus obtained inhibits Ag diffusion into the glass component in the green sheet during firing. As a result, a good circuit pattern can be formed and the board is provided with neither warpage nor deformation.

(Low-Temperature Fired Ceramic Circuit Board)

Any one of the above green sheets and conductor pastes have the inhibiting effect on Ag diffusion, and moreover, the combined use of the green sheet and the conductor paste can synergistically enhance the effect.

The low-temperature fired ceramic circuit board in this embodiment is formed by subjecting the green sheet and the conductor paste to simultaneous firing at 800 to 900° C. After the simultaneous firing, the green sheet serves as an insulating layer and the conductor paste serves as a circuit (conductor).

The low-temperature fired ceramic circuit board in this embodiment can be manufactured, as illustrated in FIG. 1, by forming a circuit pattern using a conductor paste 2 containing Ag 3 and a heat decomposable alkali metal compound 4 on a green sheet 1 containing an alumina powder and a glass powder, and then performing a binder-removing treatment, followed by simultaneous firing at 800 to 900° C. Here, the green sheet 1 on which the conductor paste 2 has been formed may be formed into a multilayer by performing a binder-removing treatment and simultaneous firing after being laminated and integrated.

The method of forming the circuit pattern is not particularly limited, and any known method such as screen printing can be used.

The method of laminating and integrating the green sheet 1 on which the circuit pattern has been formed is not particularly limited, and a press treatment by thermal compression bonding may be performed, for example.

The method for the binder-removing treatment is not particularly limited, and just keeping the green sheet 1 under heating at 300 to 600° C. is enough to remove a binder. If the green sheet 1 is kept under heating in the above temperature range, the binder component contained in the green sheet 1 is decomposed into a gas, which can be removed, and the heat decomposable alkali metal compound 4 contained in the conductor paste 2 is decomposed, and the decomposition product can be diffused into the glass component in the green sheet 1. As a result, Ag 3 can be inhibited from diffusing into the glass component in the green sheet. Further, the time for keeping the green sheet 1 under heating is not particularly limited, and may be suitably set depending, for example, on the kind, size, and number of laminated layers of the green sheet 1.

It should be noted that, when the heat decomposable alkali metal compound 4 does not decompose in the above-mentioned temperature range, the heat decomposable alkali metal compound 4 may be decomposed in a different temperature range and the decomposition product may be diffused into the glass component in the green sheet 1.

After the binder-removing treatment, simultaneous firing is performed at 800 to 900° C. to densify the green sheet 1. The firing time is not particularly limited, and may be suitably set depending, for example, on the kind, size, and number of laminated layers of the green sheet 1.

The low-temperature fired ceramic circuit board to be manufactured as described above becomes a low-temperature fired ceramic circuit board having a good circuit pattern and being free of warpage and deformation because the decomposition product of the heat decomposable alkali metal compound 4 diffuses (that is, a diffusion portion 7 is formed) in the vicinity of the surface of a ceramic board 5 on which a circuit 6 has been formed, and hence the diffusion of Ag 3 can be inhibited.

Figure 2:
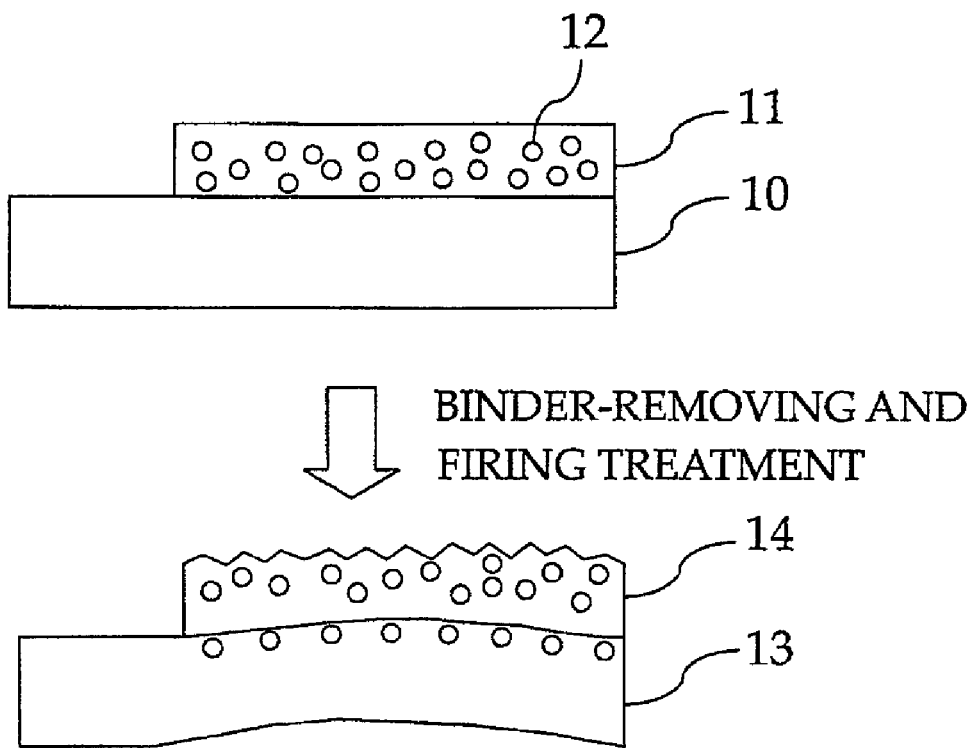
FIG. 2 is a diagram illustrating a conventional manufacturing process of a low-temperature fired ceramic circuit board.

In contrast, when a low-temperature fired ceramic circuit board is manufactured using a conventional conductor paste, as illustrated in FIG. 2, Ag 12 diffuses (transfers) from a conductor paste 11 into a glass component in a green sheet 10 during a binder-removing step or firing. As a result, in the green sheet 10 in which Ag 12 has diffused, the softening point of the glass component declines, causing shrinkage behavior in the part to change. As a result, board warpage and conductor wrinkles due to shrinkage unevenness occur. In addition, owing to a decline in the softening point of the glass component, the viscosity of the glass component becomes low at a temperature lower than a predetermined temperature, and the glass component infiltrates the conductor before sintering starts. As a result, conductor wrinkles are produced and the glass component comes up on the conductor surface.

EXAMPLES

Hereinafter, the present invention is described specifically by showing examples, but the present invention is not limited to the following examples.

Examples 1 to 3, and Comparative Examples 1 and 2

The respective glass components according to the glass compositions listed in Table 1 were mixed and melted at 1400 to 1600° C., followed by pulverization using a stamp mill or a ball mill. Thus, glass powders each having an average particle diameter of 2 μm were prepared.

Next, 50 g of each of the glass powders and 50 g of an alumina powder having an average particle diameter of 2 μm (purity: 99% or more) were mixed using a ball mill. Thus, a powder for a green sheet was prepared. After that, appropriate amounts of PVD, di-n-butyl phthalate, triolein, and ethanol were further added to the powders to thus prepare a slurry.

Then, the slurry was used to produce green sheets having a thickness of about 100 μm by a doctor blade method.

Thirty pieces of the green sheets were laminated and integrated by isostatic pressing in warm water, followed by firing at 850° C. for 1 hour. Thus, a low-temperature fired ceramic board sample was produced. The board sample was cut using water as a coolant into pieces each having a diameter of about 1.3 mm and a length of about 40 mm. Next, the resultant board samples were evaluated for dielectric properties in the microwave band by a perturbation method using a $TM_{010}$ resonator with a resonance frequency of about 10 GHz. Moreover, the porosity in the board samples was calculated by the difference between the specific gravity of the powder for a green sheet and the specific gravity of the board sample. Table 2 shows the results.

Meanwhile, as a reference, a commercially available Ag conductor paste was used to print a circuit pattern on the above-mentioned green sheet. Thus, a circuit board sample was produced. The circuit board sample was evaluated for shrinkage consistency with the Ag conductor paste. After a circuit pattern had been printed on the green sheet, six pieces of the green sheets were laminated and integrated by isostatic pressing in warm water, followed by cutting the resultant to square pieces each having a size of 1 inch (2.54 cm) and performing firing at 850° C. for 1 hour. Thus, circuit board samples were produced. The circuit board samples were evaluated as to whether or not a practical circuit board free of warpage could be obtained. In the evaluation, practicality was determined based on the following criteria. That is, the case where the degree of warpage was 50 μm or less per inch was defined as practical, and the case where the degree of warpage was more than 50 μm per inch was defined as impractical. Table 2 shows the results.

TABLE 2

|  | Relative dielectric constant ($\epsilon r$) | Dielectric loss tangent ($\tan \delta$) | $\epsilon r \times \tan \delta$ | Porosity (%) | Practicality as fired board |
|---|---|---|---|---|---|
| Example 1 | 7.4 | 0.0027 | 0.0200 | 2 | Practical |
| Example 2 | 6.8 | 0.0019 | 0.0129 | 2 | Practical |
| Example 3 | 6.7 | 0.0022 | 0.0147 | 2 | Practical |
| Comparative Example 1 | 6.8 | 0.0021 | 0.0143 | 1 | Impractical |
| Comparative Example 2 | 4.9 | 0.0031 | 0.0152 | 21 | Impractical |

TABLE 1

| | Glass composition (% by weight) | | | | | | | | | |
|---|---|---|---|---|---|---|---|---|---|---|
| | $SiO_2$ | $B_2O_3$ | $Al_2O_3$ | BaO | CaO | MgO | $R_2O$ | $MO_2$ | ZnO | CuO |
| Example 1 | 38.5 | 22.0 | 17.0 | 10.0 | 4.0 | 2.0 | 0.5 ($Li_2O$) | 0.5 ($ZrO_2$) | 5.5 | 0.0 |
| Example 2 | 35.0 | 30.0 | 12.0 | 2.5 | 10.0 | 4.0 | 0.2 ($Li_2O$) | 0.5 ($ZrO_2$) | 5.5 | 0.3 |
| Example 3 | 39.0 | 21.0 | 17.0 | 10.0 | 6.0 | 1.0 | 0.5 ($Li_2O$) | 0.5 ($ZrO_2$) | 5.0 | 0.0 |
| Comparative Example 1 | 38.0 | 28.0 | 10.0 | 11.5 | 3.0 | 2.0 | 0.0 | 1.5 ($ZrO_2$) | 6.0 | 0.0 |
| Comparative Example 2 | 56.0 | 20.0 | 15.0 | 0.0 | 6.0 | 1.0 | 0.0 | 2.0 ($ZrO_2$) | 0.0 | 0.0 |

As shown in Table 2, each of the board samples of Examples 1 to 3 was found to have excellent dielectric properties because of the small product of the relative dielectric constant and dielectric loss tangent, and to have a low porosity. Further, the samples were each practical as a circuit board, though this is based on the relationship with a commercially available Ag conductor paste.

Meanwhile, the board sample of Comparative Example 1 was also found to have excellent dielectric properties and a low porosity. However, the sample was impractical as a circuit board, though this is based on the relationship with the commercially available Ag conductor paste. Further, the board sample of Comparative Example 2 was found to have good dielectric properties but to have a high porosity and high hygroscopicity. Further, the sample was impractical as a circuit board, though this is based on the relationship with the commercially available Ag conductor paste.

Examples 4 and 5

The green sheet produced in Example 1 was used.

A conductor paste was obtained by loading metal particles including 98.5% by weight of Ag particles (average particle diameter: about 1 μm) and 1.5% by weight of Pd particles (average particle diameter: about 1 μm), a heat decomposable alkali metal compound, an organic component including a terpineol solution containing 1 to 3% by weight of ethyl cellulose, a dispersant, and a plasticizer to an automatic mortar, and kneading the mixture for 3 to 4 hours. Here, the weight ratio of the Ag particles to the organic component was adjusted to the range of 77:23 to 82:18 in agreement with the variation in the viscosity of the conductor paste. Meanwhile, Table 3 shows the kind and blending amount of the heat decomposable alkali metal compound used.

Next, after the above-mentioned conductor paste was used to print a circuit pattern on the green sheet described above, nine pieces of the green sheets were stacked, followed by lamination by thermal compression bonding under a pressure of 30 MPa at 80° C. for 15 minutes. Next, the laminate was fired at about 500° C. for 2 hours, and was then fired at 780 to 850° C. for 30 minutes, thereby obtaining a low-temperature fired ceramic circuit board.

Examples 6 and 7

In Example 6, a low-temperature fired ceramic circuit board was obtained by the same procedure as that in Example 4 except that the green sheet produced in Example 2 was used.

In Example 7, a low-temperature fired ceramic circuit board was obtained by the same procedure as that in Example 5 except that the green sheet produced in Example 2 was used.

Examples 8 and 9

In Example 8, a low-temperature fired ceramic circuit board was obtained by the same procedure as that in Example 4 except that the green sheet produced in Example 3 was used.

In Example 9, a low-temperature fired ceramic circuit board was obtained by the same procedure as that in Example 5 except that the green sheet produced in Example 3 was used.

Comparative Examples 3 to 5

Low-temperature fired ceramic circuit boards were each obtained by the same procedure as that in Example 4 except that the green sheet produced in Comparative Example 1 and a conductor paste in which the heat decomposable alkali metal compound shown in Table 3 had been blended at a predetermined amount or a conductor paste in which the heat decomposable alkali metal compound had not been blended were used.

TABLE 3

| | Kind of compound | Amount of compound blended per 100 parts by weight of metal particles (part by weight) | Number of compound metal atoms per 100 metal atoms of metal particles |
|---|---|---|---|
| Example 4 | Potassium carbonate | 1.0 | 1.6 |
| Example 5 | Potassium carbonate | 0.5 | 0.78 |
| Comparative Example 3 | Potassium carbonate | 1.0 | 1.6 |
| Comparative Example 4 | Potassium carbonate | 0.5 | 0.78 |
| Comparative Example 5 | — | — | — |

Each of the low-temperature fired ceramic circuit boards which were obtained in Examples 4 to 9 and Comparative Examples 3 to 5 described above was evaluated for the following items.

(1) Degree of Warpage of Low-Temperature Fired Ceramic Circuit Board (Degree of Deformation)

The difference between the height of the central portion of the board and the height of portions other than the central portion of the board was defined as the degree of warpage, and the difference was measured. The smaller the degree of warpage, the better, in this evaluation, but a degree of warpage of 200 μm or less is a range that is practically usable.

(2) Conductor Surface Roughness of Low-Temperature Fired Ceramic Circuit Board

The maximum height difference between a convex portion and a concave portion on the conductor surface was measured as the conductor surface roughness. Because many minute wires each having a diameter of 25 μm are used for connecting the circuit pattern on the low-temperature fired ceramic circuit board and parts mounted on the board, if the maximum height difference is not more than 8 μm, which is the upper limit of the conductor surface roughness, and at which a wire having a diameter of 25 μm is connectable, the surface roughness is acceptable.

(3) Area Ratio of Glass Component on Conductor Surface

The area ratio of the glass component on the conductor surface was determined by subjecting black-and-white photograph data to a binarization treatment and calculating the area of the black portion by taking advantage of the fact that in a COMPO image (reflected electron image) of a scanning electron microscope (SEM), the image of a glass portion becomes black and the image of an Ag conductor portion becomes white. Here, the glass component on the conductor surface is desirably absent because the glass component causes a plating defect, resulting in the reduction of wire bonding property and in solder scattering. However, the glass component also plays a role as an adhesive with the conductor, and hence the infiltration of the glass component into the conductor is considered to be necessary to some extent. Thus, it is recommended that the infiltration of the glass component into the conductor be to such an extent that neither board warpage nor conductor wrinkles are caused. Further, a surface treatment can be performed for removing the glass component on the conductor surface during a plating step. Accordingly, it is recommended that the area ratio of the glass component be to such an extent that inconvenience is not caused during the plating step. In view of the foregoing, the practically usable range of the ratio of the glass component on the conductor surface is 30% or less.

(4) Sheet Resistance of Conductor

The sheet resistance of the conductor was measured by using a contact-type four-terminal surface resistance meter.

(5) Content of Alkali Metal Atoms in Conductor Portion

The content of the alkali metal atoms in the conductor portion was measured by using a wavelength-dispersive X-ray spectrometer.

Table 4 shows the evaluation results of items (1) to (5) described above.

TABLE 4

|  | Degree of board warpage (μm) | Conductor surface roughness (μm) | Area ratio of glass component (%) | Sheet resistance of conductor (mΩ/□) | Content of alkali metal atoms in conductor portion (atomic percent) |
| --- | --- | --- | --- | --- | --- |
| Example 4 | 22.0 | 5.3 | 13.0 | 3.0 | 1.3 |
| Example 5 | 25.0 | 5.5 | 17.0 | 3.7 | 0.7 |
| Example 6 | 26.0 | 5.5 | 25.0 | 2.8 | 0.4 |
| Example 7 | 35.0 | 5.9 | 11.0 | 2.8 | 1.7 |
| Example 8 | 32.0 | 5.5 | 15.0 | 2.6 | 1.5 |
| Example 9 | 35.0 | 5.6 | 26.0 | 3.3 | 0.6 |
| Comparative Example 3 | 31.0 | 8.0 | 35.0 | 3.0 | 1.3 |
| Comparative Example 4 | 26.0 | 7.0 | 19.0 | 3.7 | 0.7 |
| Comparative Example 5 | 355 | 30 | 58 | 4.5 | — |

As shown in Table 4, the low-temperature fired ceramic circuit boards of Comparative Examples 3 and 4 each produced by using the green sheet produced in Comparative Example 1 and a predetermined conductor paste were low in the degree of board warpage, conductor surface roughness, and the area ratio of the glass component on the conductor surface compared with the low-temperature fired ceramic circuit board of Comparative Example 5 produced by using the green sheet produced in Comparative Example 1 and the conductor paste in which no heat decomposable alkali metal compound was blended. The results show that using a predetermined conductor paste provides a reducing effect on the degree of board warpage, conductor surface roughness, and the area ratio of the glass component on the conductor surface. Meanwhile, the low-temperature fired ceramic circuit boards of Comparative Examples 3 and 4 were each also low in sheet resistance.

However, the low-temperature fired ceramic circuit board of Comparative Example 3 was large in the area ratio of the glass component, showing that the combination with the green sheet produced in Comparative Example 1 does not sufficiently provide the effect of using a predetermined conductor paste.

On the other hand, the low-temperature fired ceramic circuit boards of Examples 4 to 9 produced by combining a predetermined green sheet and a predetermined conductor paste in various ratios were sufficiently low in the degree of board warpage, conductor surface roughness, and the area ratio of the glass component on the conductor surface, and were low in sheet resistance as well. In particular, the low-temperature fired ceramic circuit boards of Examples 4 to 9 each exhibited a conductor surface roughness of 5 μm to 6 μm, showing the result that the conductor surface roughness was far lower than 8 μm, which was the upper limit. The results show that more stable wire bonding can be performed. That is, the combined use of a predetermined green sheet and a predetermined conductor paste further enhances the inhibiting effect on Ag diffusion, and can sufficiently reduce the degree of board warpage, conductor surface roughness, and the area ratio of the glass component on the conductor surface.

As is evident from the results described above, the low-temperature fired ceramic circuit board of the present invention can be fired at 900° C. or lower, has a small degree of board warpage and conductor wrinkles when simultaneous firing is performed with an Ag-based conductor paste, has low hygroscopicity, with excellent dielectric properties in high-frequency bands (microwave and millimeter-wave bands), and has a flat circuit surface free from coming up of a glass component.

The invention claimed is:

1. A low-temperature fired ceramic circuit board formed by subjecting a conductor paste and a green sheet to simultaneous firing at 800 to 900° C., wherein:
   the green sheet comprises (1) a glass powder which contains 35 to 39% by weight of $SiO_2$, 9 to 17% by weight of $Al_2O_3$, 21 to 40% by weight of $B_2O_3$, 10 to 20% by weight of R'O where R' represents at least one kind selected from the group consisting of Mg, Ca, and Ba, 0.2 to 2% by weight of $Li_2O$, and 0.5 to 2% by weight of $MO_2$ where M represents at least one kind selected from the group consisting of Ti and Zr, and (2) an alumina powder at a weight ratio of the glass powder to the alumina powder of 4:6 to 6:4; and
   the conductor paste comprises Ag-containing metal particles, a binder component, and a heat decomposable alkali metal compound, and a content of the heat decomposable alkali metal compound is such that 0.13 to 7.8 alkali metal atoms are contained for each 100 metal atoms in the metal particles.

2. The low-temperature fired ceramic circuit board according to claim 1, wherein the green sheet comprises a glass powder which contains 37 to 39% by weight of $SiO_2$.

3. The low-temperature fired ceramic circuit board according to claim 2, wherein the green sheet comprises a glass powder which contains 22 to 30% by weight of $B_2O_3$.

4. The low-temperature fired ceramic circuit board according to claim 3, wherein the green sheet comprises a glass powder which contains 12 to 16% by weight of $Al_2O_3$.

5. The low-temperature fired ceramic circuit board according to claim 1, wherein the green sheet comprises a glass powder which further contains more than 0% by weight and less than 10% by weight of ZnO.

6. The low-temperature fired ceramic circuit board according to claim 5, wherein the green sheet comprises a glass powder which further contains 4 to 6% by weight of ZnO.

7. The low-temperature fired ceramic circuit board according to claim 1, wherein the green sheet comprises a glass powder which further contains more than 0% by weight and less than 0.5% by weight of CuO.

8. The low-temperature fired ceramic circuit board according to claim 1, wherein the content of the heat disposable alkali metal compound in the conductor paste is such that 0.78 to 4.8 alkali metal atoms are contained for each 100 metal atoms in the metal particles.

9. A low-temperature fired ceramic circuit board formed by subjecting a conductor paste and a green sheet to simultaneous firing at 800 to 900° C., wherein:
  the green sheet comprises (1) a glass powder which contains 37 to 39% by weight of $SiO_2$, 12 to 16% by weight of $Al_2O_3$, 22 to 30% by weight of $B_2O_3$, 10 to 20% by weight of R'O where R' represents at least one kind selected from the group consisting of Mg, Ca, and Ba, 0.2 to 2% by weight of $Li_2O$, and 0.5 to 2% by weight of $MO_2$ where M represents at least one kind selected from the group consisting of Ti and Zr, and (2) an alumina powder at a weight ratio of the glass powder to the alumina powder of 4:6 to 6:4; and
  the conductor paste comprises Ag-containing metal particles, a binder component, and a heat decomposable alkali metal compound, and a content of the heat decomposable alkali metal compound is such that 0.78 to 4.8 alkali metal atoms are contained for each 100 metal atoms in the metal particles.

10. The low-temperature fired ceramic circuit board according to claim 9, wherein the green sheet comprises a glass powder which further contains more than 0% by weight and less than 10% by weight of ZnO.

11. The low-temperature fired ceramic circuit board according to claim 10, wherein the green sheet comprises a glass powder which further contains 4 to 6% by weight of ZnO.

12. The low-temperature fired ceramic circuit board according to claim 9, wherein the green sheet comprises a glass powder which further contains more than 0% by weight and less than 0.5% by weight of CuO.

* * * * *